(12) United States Patent
Huang et al.

(10) Patent No.: US 8,272,344 B2
(45) Date of Patent: Sep. 25, 2012

(54) WET COATING SYSTEM HAVING ANNEALING CHAMBER

(75) Inventors: Chien-Hao Huang, Taipei Hsien (TW); Shao-Kai Pei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 349 days.

(21) Appl. No.: 12/641,581

(22) Filed: Dec. 18, 2009

(65) Prior Publication Data

US 2011/0030614 A1  Feb. 10, 2011

(30) Foreign Application Priority Data

Aug. 5, 2009  (CN) .......................... 2009 1 0305218

(51) Int. Cl.
*B05C 3/00* (2006.01)
*B05C 3/02* (2006.01)
*B05C 13/02* (2006.01)

(52) U.S. Cl. ........... 118/423; 118/66; 118/500; 118/503

(58) Field of Classification Search .................. 118/400, 118/421, 423, 62, 63, 64, 66, 666, 667, 500, 118/503, 428, 429; 427/430.1; 430/322, 430/323; 355/53, 30

See application file for complete search history.

(56) References Cited

U.S. PATENT DOCUMENTS

| | | | |
|---|---|---|---|
| 3,694,117 A * | 9/1972 | Gould et al. | 425/93 |
| 6,440,498 B2 * | 8/2002 | Schaller | 427/261 |
| 2002/0100908 A1 * | 8/2002 | Yudasaka et al. | 257/57 |
| 2004/0020601 A1 * | 2/2004 | Zhao et al. | 156/345.32 |
| 2006/0115653 A1 * | 6/2006 | Soerens et al. | 428/423.1 |

* cited by examiner

*Primary Examiner* — Yewebdar Tadesse
*(74) Attorney, Agent, or Firm* — Altis Law Group, Inc.

(57) ABSTRACT

An exemplary wet coating system includes a coating chamber, an annealing chamber, an unloading chamber, and a mechanical arm. The coating chamber is configured for allowing a substrate being wet coated therein. The unloading chamber is configured for allowing the substrate being unloaded therein. The annealing chamber is interposed between and communicated with the coating chamber and the unloading chamber and is configured for allowing the substrate being annealed therein. The communicated coating chamber, annealing chamber, and unloading chamber are vacuumized. The mechanical arm is configured for holding the substrate and moving the substrate across the coating chamber, the annealing chamber, and the unloading chamber.

19 Claims, 8 Drawing Sheets

WET COATING SYSTEM HAVING ANNEALING CHAMBER

BACKGROUND

1. Technical Field

This present disclosure relates to wet coating technologies and, particularly, to a wet coating system for forming a thin film on a substrate. The wet coating system is capable of avoiding or at least reducing oxidization of the thin film during the transportation of the substrate film from a coating solution to an annealing chamber.

2. Description of Related Art

Generally, a thin film can be formed on a substrate by wet coating. In the process of wet coating, the substrate is firstly dipped into a coating solution and then is transported to an annealing chamber. In the annealing chamber, the substrate is annealed so that the thin film can achieve certain performances. However, during the transportation of the substrate, the substrate is exposed to the air and therefore the thin film may be oxidized. This may adversely effect the performance of the thin film.

Therefore, it is desirable to provide a wet coating system, which can overcome the above-mentioned problems.

DETAILED DESCRIPTION

Figure 1:
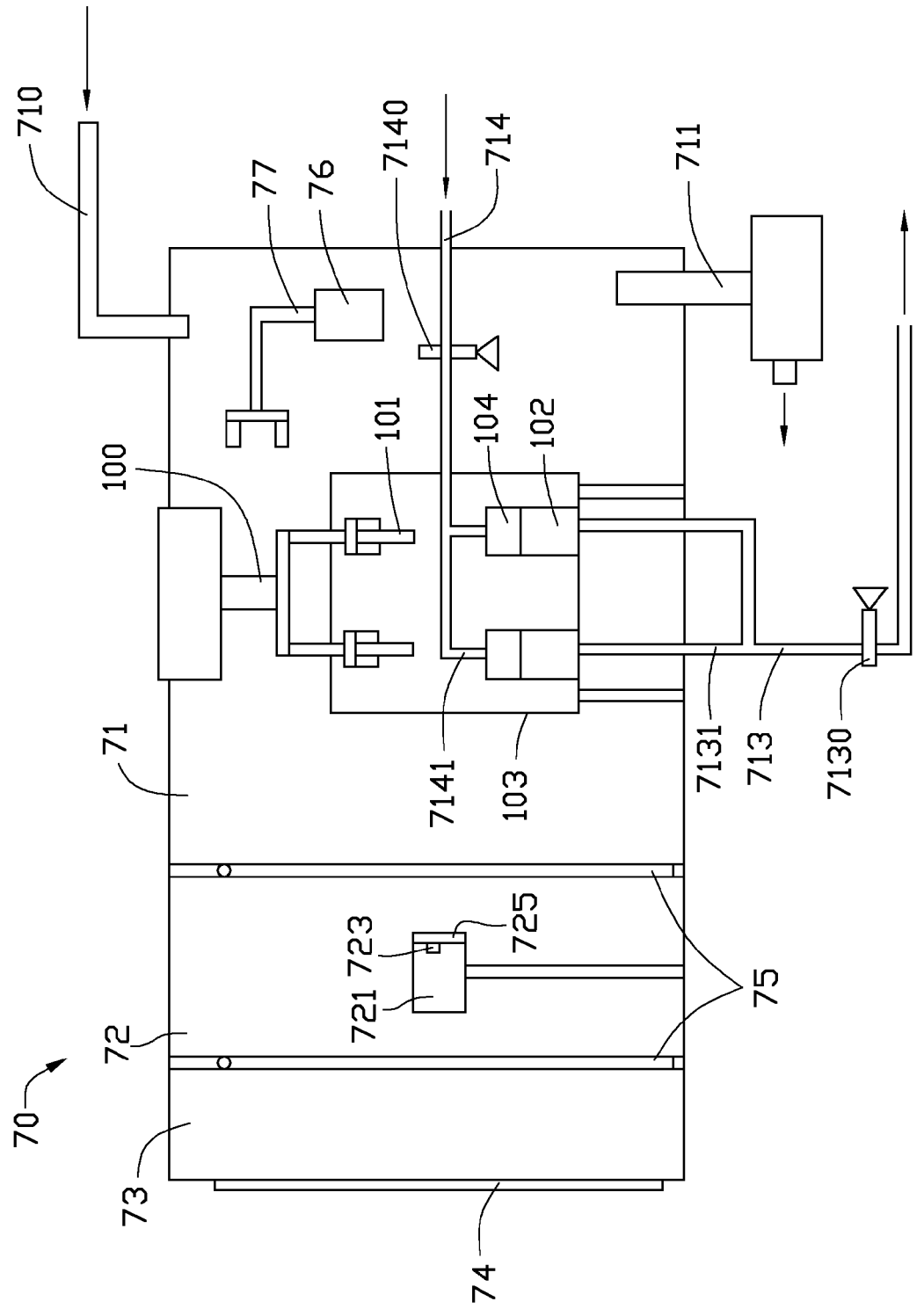
FIG. 1 is a schematic view of a wet coating system, according to a first exemplary embodiment.

Referring to FIG. 1, a wet coating system 70, according to an exemplary embodiment, includes a coating chamber 71, an annealing chamber 72, an unloading chamber 73, an access door 74, two automatic doors 75, and a mechanical arm 77.

The annealing chamber 72 is interposed between the coating chamber 71 and the unloading chamber 73. One of the two automatic doors 75 is interposed between the coating chamber 71 and the annealing chamber 72 and configured for closing an entrance (not labeled) from the coating chamber 71 to the annealing chamber 72. The other automatic door 75 is interposed between the annealing chamber 72 and the unloading chamber 73 and configured for closing an entrance (not labeled) from the annealing chamber 72 to the unloading chamber 73. The access door 74 is disposed on the unloading chamber 73 and configured for closing an entrance (not labeled) from outside to the unloading chamber 73. Before the process of wet coating, a number of substrates 101 are loaded in the coating chamber 71 (see below). Then, the access door 74 is closed and the two automatic doors 75 are opened, the coating chamber 71, the annealing chamber 72, and the unloading chamber 73 communicate with each other and are vacuumized to form a closed vacuum space.

The mechanical arm 77 is configured for holding and transporting the substrates 101 among the coating chamber 71, the annealing chamber 72, and the unloading chamber 73. The wet coating system 70 may further include a controller 76. The controller 76 is configured for coordinating the mechanical arm 77 and the automatic doors 75 so that the automatic doors 75 are kept closed but opened when the mechanical arm 77 moves across a corresponding entrance between the coating chamber 71 and the annealing chamber 72 or between the annealing chamber 72 and the unloading chamber 73.

In the coating chamber 71, the wet coating system 70 further includes a reacting room 103, a number of containers 104 placed in the reacting room 103 and filled with a coating solution 102, and a substrate holding unit 100 suspended above the reacting room 103 and movable down towards the containers 104 or up away from the containers 104. The substrate holding unit 100 is configured for holding a number of substrates 101 and moving into the corresponding containers 104 to dip the substrates 101 in the coating solution 102. The coating solution 102 is configured for liquidly depositing a thin film (not shown) on the substrates 101.

Figure 2:
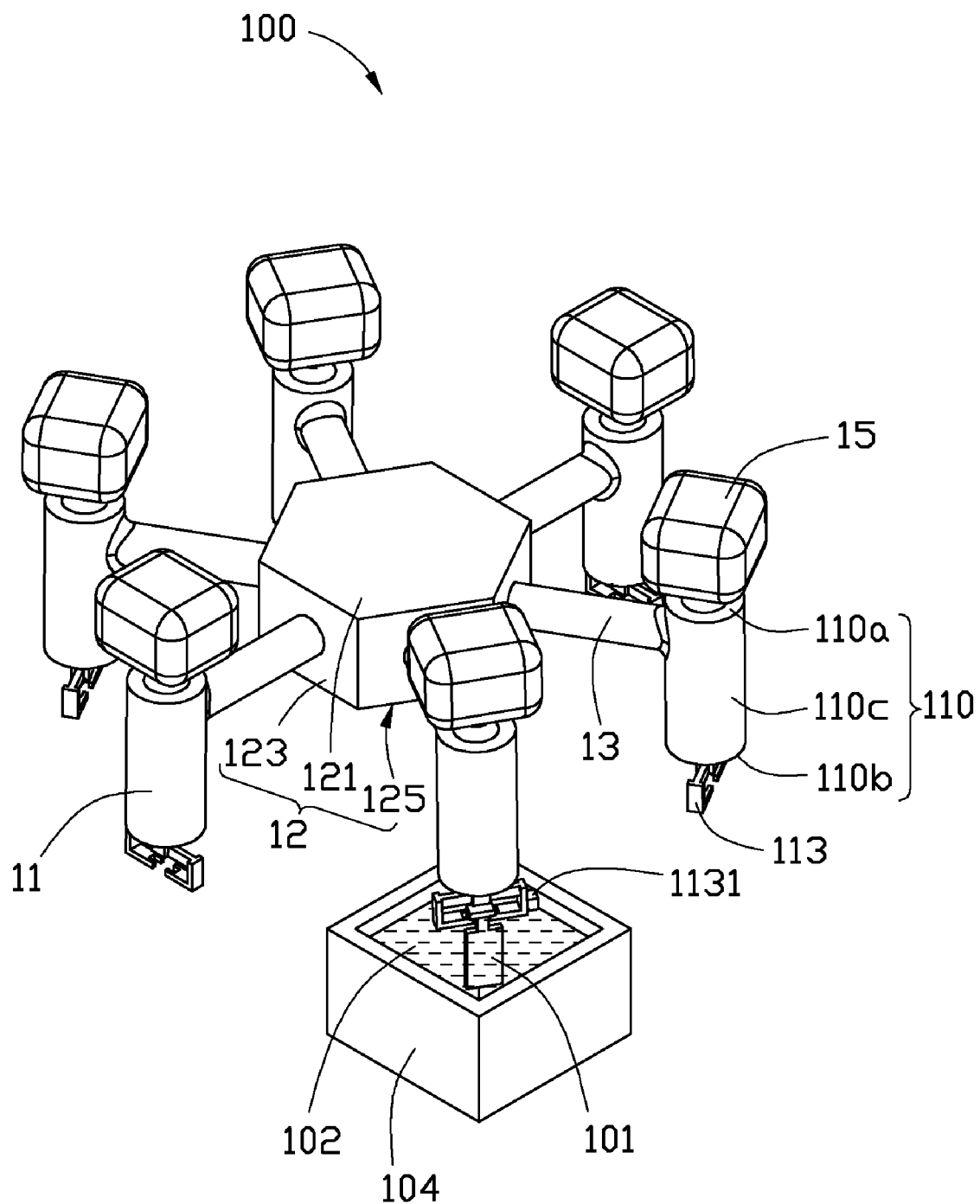
FIG. 2 is an isometric, schematic view of a substrate holding unit of the wet coating system, according to a first exemplary embodiment.

Also referring to FIG. 2, in this embodiment, the substrate holding unit 100 includes six holding members 11, a main body 12, and six connecting arms 13; and the substrate holding unit 100 is capable of holding six substrates 101 simultaneously.

The main body 12 is configured for supporting the holding members 11 and is a hexagonal cylinder in shape. In detail, the main body 12 includes a regular hexagon top surface 121, a regular hexagon bottom surface 125, and six rectangular side surfaces 123 connecting the top surface 121 and the bottom surface 125. The connecting arms 13 radially extend outwards from corresponding side surfaces 123.

Each of the holding members 11 includes a suspending arm 110 and a clamper 113. The suspending arm 110 is a circular cylinder in shape and includes an upper end surface 110a, a lower end surface 110b, and a cylindrical side surface 110c connecting the upper end surface 110a to the lower end surface 110b. Each of the clampers 113 is structured and mechanized to fittingly clamp one substrate 101 and is connected to one end of the suspend arm 110 corresponding to the lower end surface 110b. The other end of the suspending arm 110 corresponding to the upper end surface 110a is connected to a corresponding connecting arm 13.

In other alternative embodiments, the main body 12 is not limited to be a hexagonal cylinder, but can be other appropriate shapes, such as, a cube or a circular cylinder. The number of the connecting arms 13 and the holding members 11 are also not limited to six, but can be other numbers.

To monitor the process of depositing film on the substrates 101, the wet coating system 70 can further include six monitors 15. Each of the monitors 15 can be installed on a corresponding upper end surface 110a and is configured for monitoring the dipping depth, the dipping time and other film depositing parameters of a corresponding substrate 101. To realize various measurements of the deposition parameters, each of the monitors 15 can include a sensor 1131. Practically, the sensor 1131 is installed in a vicinity of the substrate 101. Therefore, in this embodiment, the sensor 1131 is attached to the clamper 113.

Typically, the coating solution 102 is volatilizable. Volatilization gases from one type of coating solution 102 can mix with other kinds of volatilization gases when more than one type of coating solution 102 is employed. This may reduce the purity of each type of coating solution 102. Therefore, to avoid the reduction of the purity of each type of coating solution, the wet coating system 70 further includes a gas introducing unit 710 and a gas expelling unit 711. The gas introducing unit 710 is configured for introducing noble gas (not shown), e.g., nitrogen, into the coating chamber 71. The noble gas can reduce the density of the volatilization gases of the coating solution 102. This can reduce the effect of the different volatilization gases mixing. The gas expelling unit 711 is configured for expelling the introduced noble gas and the volatilization gases of the coating solution 102 from the coating chamber 71. This can further reduce the effect of mixing of the different volatilization gases.

To facilitate discharging the coating solution 102 into the containers 104 and removing the coating solution 102 from the containers 104, the wet coating system 70 further includes an inlet pipe 714, an inlet valve 7140 installed on the inlet pipe 714 to control the flow of the coating solution 102 flowing in the inlet pipe 714, a number of inlet branches 7141 each of which communicates the inlet pipe 714 with a corresponding container 104, a number of discharging branches 7031 each of which communicates a corresponding container 104 to discharge the coating solution 102 from the corresponding container 104, an outlet pipe 713 which communicates the discharging branches 7131 to collect the coating solution 102 of all the discharging branches 7131, and an outlet valve 7130 installed on the outlet pipe 713 to control the flow of the coating solution 102 flowing in the outlet pipe 713. Practically, each of the charging branches 7141 is connected to the top of the corresponding container 104. Each of the discharging branches 7131 is connected to the bottom of the corresponding container 104.

In the annealing chamber 72, the wet coating system 70 includes a heating member 721. The heating member 721 is used to heat the substrates 101 with the thin film, so that the adhesion of the thin film is increased. In this embodiment, the heating member 721 can heat the substrate 101 to 400~500 and remain the temperature of the substrate 101 around 400~500 for a predetermined time. To realize this heating process, the wet coating system 70 may further includes a temperature sensor 723 and a heating controller 725. The temperature sensor 723 is configured for sensing the temperature of the heating member 721 and feedbacks the sensed temperature to the heating controller 725 so that the heating controller 725 can properly control the heat member 721 to work.

The unloading chamber 73 is configured for unloading the substrates 101. Practically, after a substrate 101 has been heated, the substrate 101 is transported to the unloading chamber 73 by the mechanical arm 77 to allow the substrate 101 to naturally and slowly cool down. After the substrate 101 has cooled down, the process of annealing is finished and the substrate 101 can be unloaded by the mechanical arm 77 and taken out of the unloading chamber 73 via the access door 74.

Figure 3:
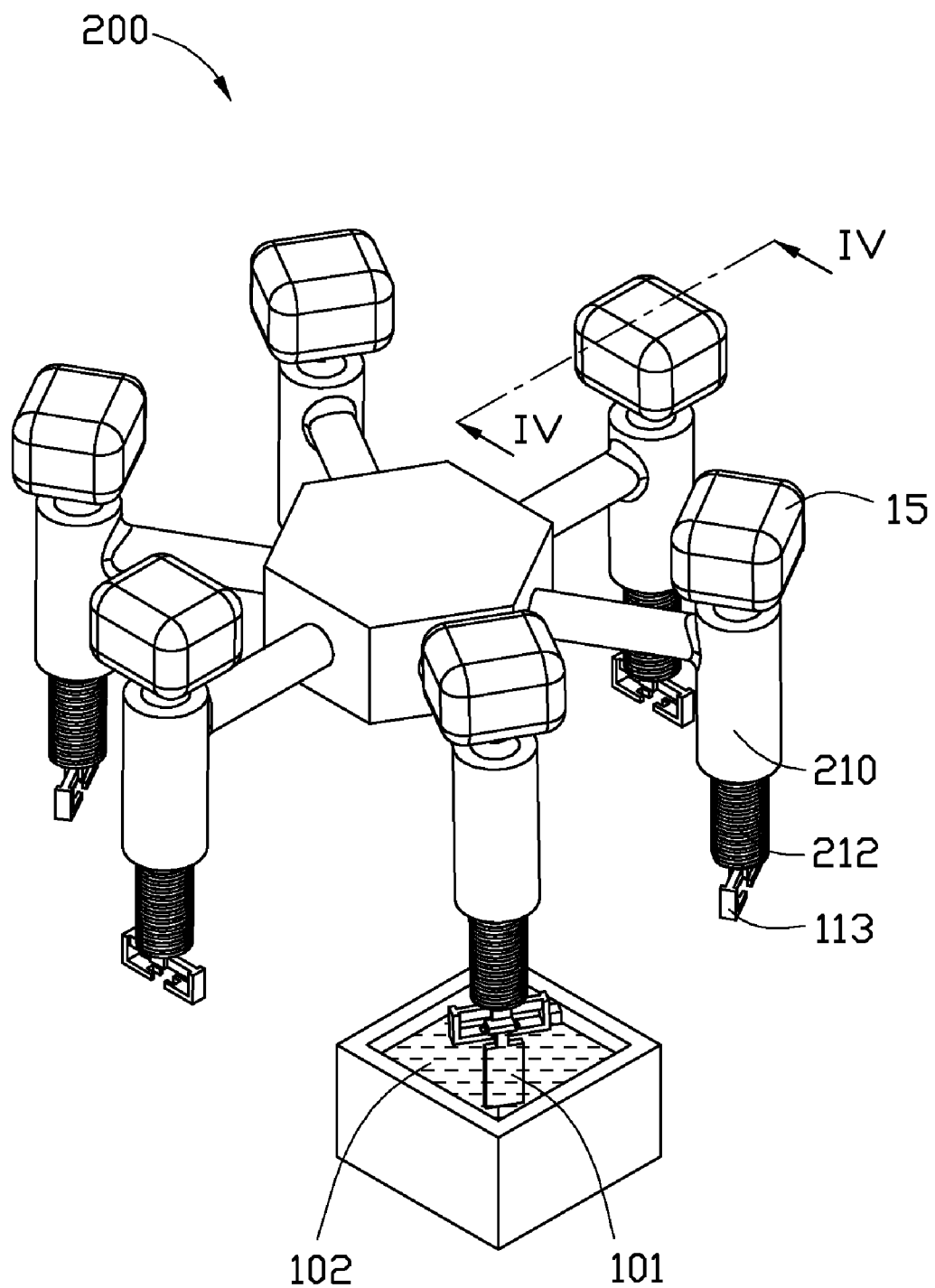
FIG. 3 is an isomeric, schematic view of a substrate holding unit of the wet coating system, according to a second exemplary embodiment.
Figure 4:
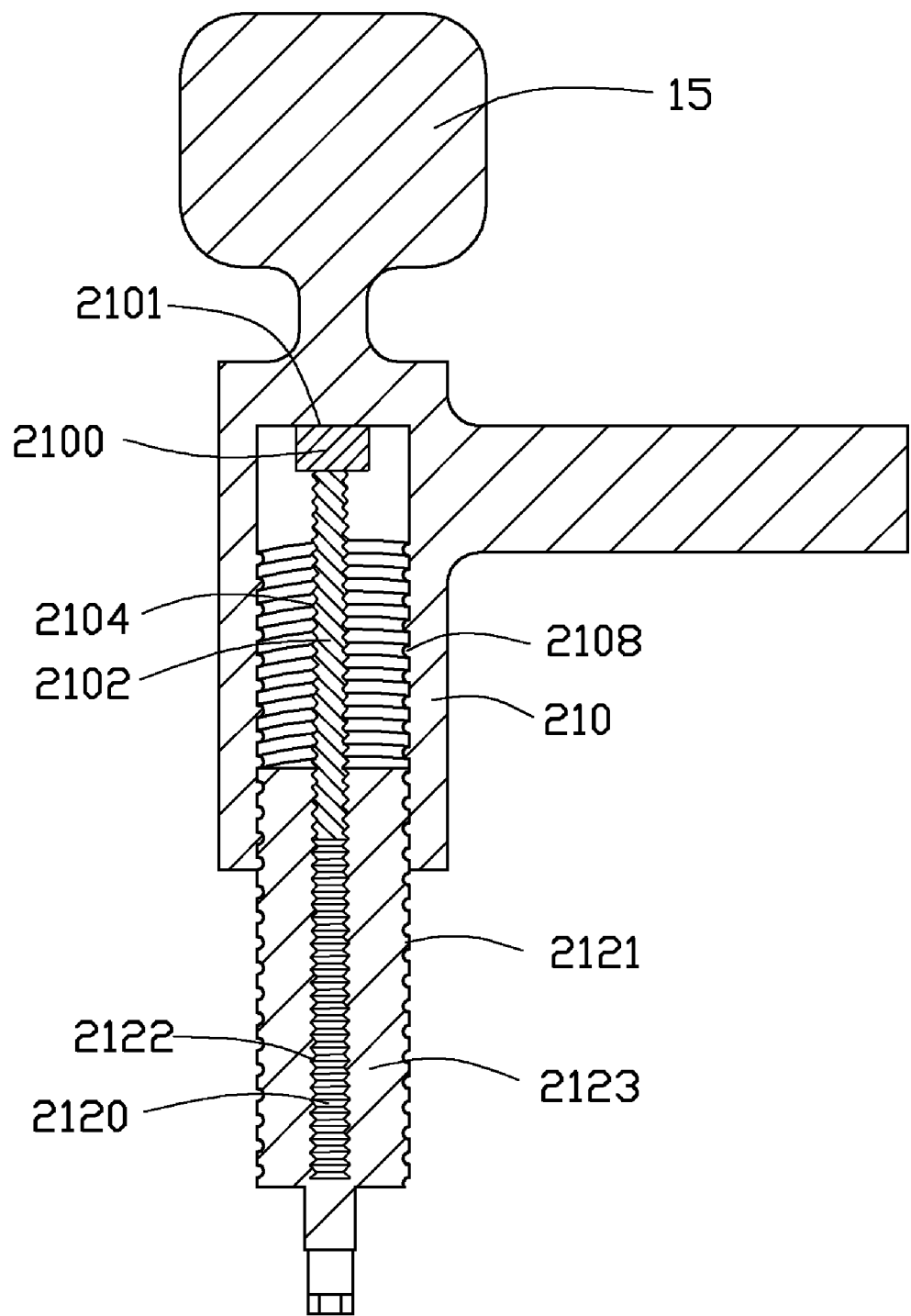
FIG. 4 is a partially cross-sectioned view taken along a line IV-IV of FIG. 3.

Referring to FIGS. 3-4, a second substrate holding unit 200, according to a second exemplary embodiment, is substantially similar to the substrate holding unit 100 but further includes a driving member 212 for driving the clamper 113 to move down into or up away from the coating solution 102. Also, to accommodate the newly added driving member 212, a suspending arm 210 of this embodiment is different from the suspending arm 110 too. The suspending arm 210 is a hollow circular cylinder in shape and includes an inner top surface 2101 and defines a first threaded section 2108 in the inner cylindrical surface thereof. The driving member 212 includes a motor 2100 and a transmission rod 2123. The motor 2100 is fixed to the inner top surface 2101 generally at the center thereof and includes a shaft 2102 with a second threaded section 2104 formed on the outer surface thereof. The transmission rod 2123 is a circular cylinder and has a diameter slightly less than the inner diameter of the suspending arm 210. The transmission rod 2123 defines a third threaded section 2121 corresponding to the first threaded section 2108 in the outer cylindrical surface thereof, a blind hole 2120 along the central axis thereof, and a fourth threaded section 2122 in the inner surface of the blind hole 2120, the fourth threaded section 2122 corresponding to the second threaded section 2104.

The transmission rod 2123 is coupled to the shaft 2102 via the second threaded section 2104 and the fourth threaded section 2122 and is coupled to the suspending arm 110 via the first threaded section 2108 and the third threaded section 2121. The motor 2100 is electrically connected to the monitor 15. The monitor 15 is further configured for controlling the motor 2100 based upon monitored deposition parameters of the substrates 101. When the movement of the substrates 101 is required, the motor 2100 rotates under control of the monitor 15. As such, the transmission rod 2123 is driven to move up or down.

Figure 5:
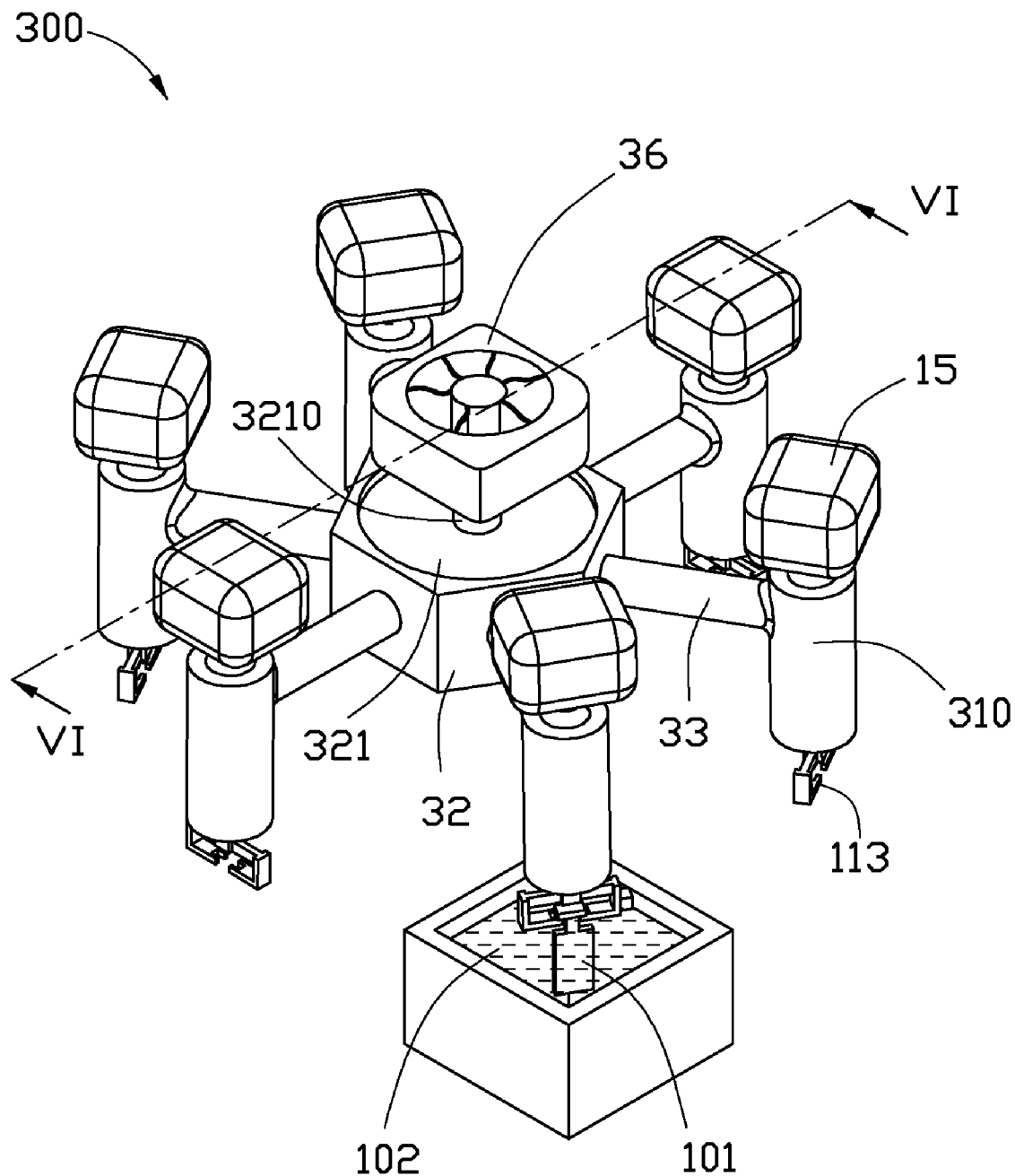
FIG. 5 is an isomeric, schematic view of a substrate holding unit of the wet coating system, according to a third exemplary embodiment.
Figure 6:
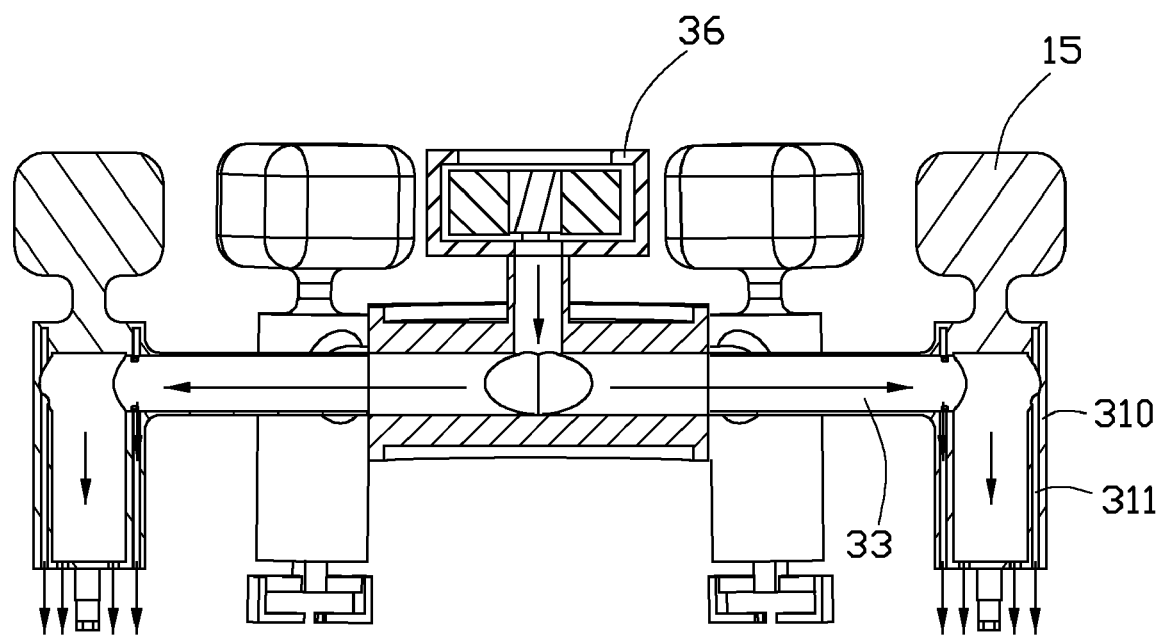
FIG. 6 is a cross-sectioned view taken along a line VI-VI of FIG. 5.

Referring to FIGS. 5-6, a third substrate holding unit 300, according to a third embodiment, is substantially similar to the substrate holding unit 100. However, in this embodiment, a main body 32, six connecting arms 33, and six suspending arms 310 are all hollow, and the inner space (not shown) of the main body 32 communicates with the inner spaces of the connecting arms 33 which in turn communicate with the inner spaces of the suspending arms 310. A top surface 321 of the main body 32 further defines an inlet 3210 communicating with the inner space of the main body 32. Each of the suspending arms 310 defines a number of outlets 311 communicating with the inner space of the suspending arms 310. The outlets 311 face the clamper 113. The substrate holding unit 300 further includes a blower 36. The blower 36 faces the inlet 3210 and is configured to blow a gas through the inlet 3210 to the outlets 311, and to the substrates 101 after the substrates 101 are drawn up away from the coating solution 102 to speed the air-drying of the coating solution 102 adhered to the substrates 101. Practically, the blower 36 can blow noble gas to the substrate 101 to avoid reactions with the coating solution 102 occurring.

Figure 7:
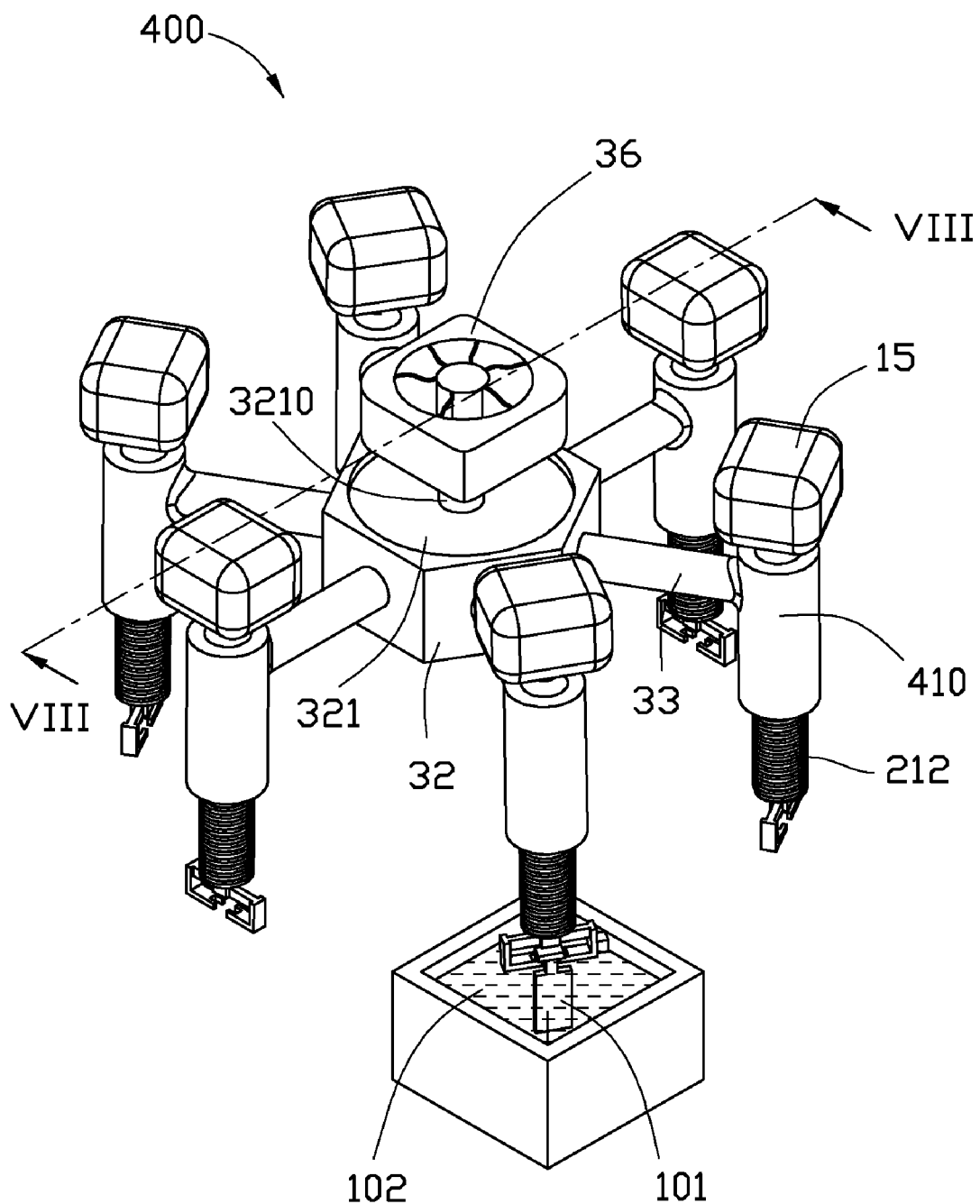
FIG. 7 is an isomeric, schematic view of a substrate holding unit of the wet coating system, according to a fourth exemplary embodiment.
Figure 8:
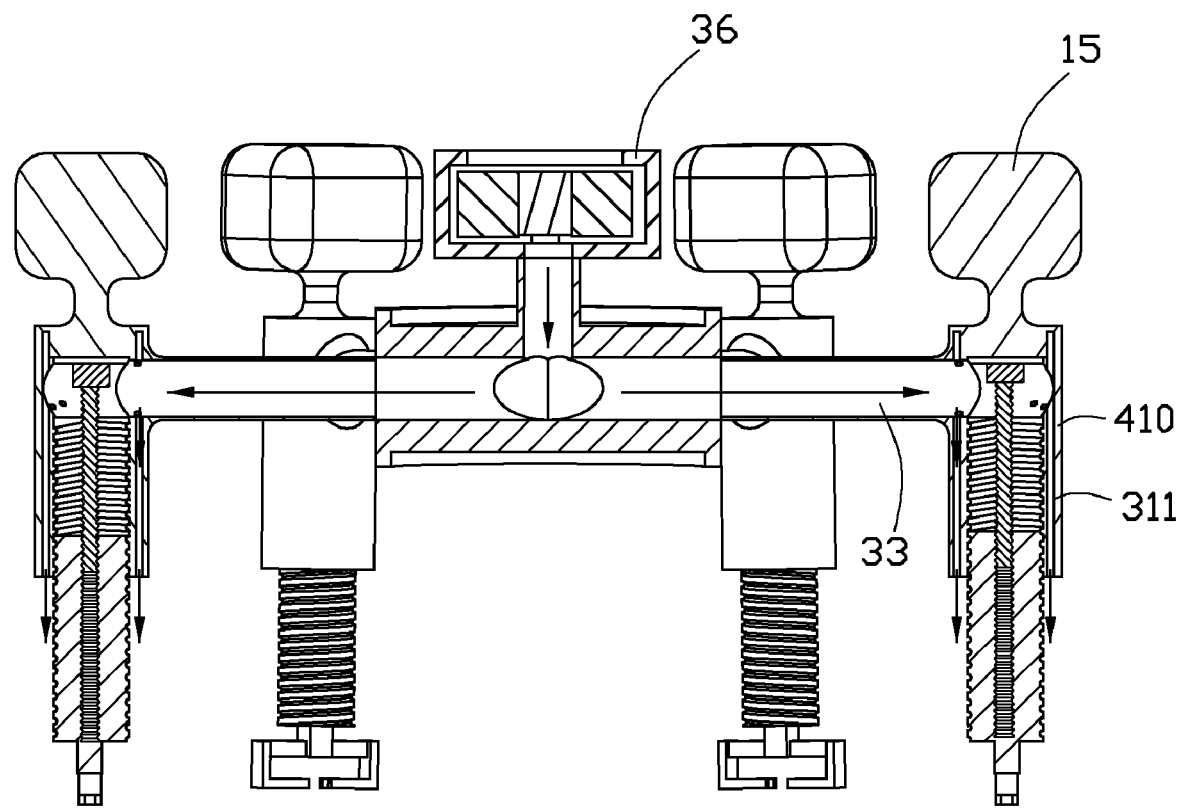
FIG. 8 is a cross-sectioned view taken along a line VIII-VIII of FIG. 7.

Referring to FIGS. 7-8, a fourth substrate holding unit 400, according to a fourth exemplary embodiment, is substantially similar to the substrate holding unit 300 but further employs a driving unit 212. Therefore, a suspending arm 410 of this embodiment is similar to the suspending arm 210 but further defines outlet 311.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A wet coating system comprising:
   a coating chamber configured for coating a substrate therein using a wet coating process;
   an unloading chamber configured for allowing the substrate to be unloaded therein;
   an annealing chamber interposed between and communicating with the coating chamber and the unloading chamber and configured for allowing the substrate to be annealed therein, the communicated coating chamber, annealing chamber, and unloading chamber being vacuumized;

a mechanical arm configured for holding the substrate and moving the substrate across the coating chamber, the annealing chamber, and the unloading chamber; and a substrate holding unit, a container, and a coating solution; the substrate holding unit and the container being disposed within the coating chamber; the container being filled with the coating solution; and the substrate holding unit being configured for holding the substrate, and moving down into the container to dip the substrate in the coating solution and up away from the container.

2. The wet coating system of claim 1, wherein the substrate holding unit comprises a main body, a holding member, and a connecting arm; the holding member being connected to the main body via the connecting arm; and the holding member being configured for holding the substrate.

3. The wet coating system of claim 2, wherein the holding member comprises a suspending arm and a damper; the suspending arm being connected to the connecting arm; and the clamper being configured for clamping the substrate.

4. The wet coating system of claim 3, wherein the substrate holding unit further comprises a driving member; the suspending arm being a hollow cylinder in shape and comprising an inner top surface, and the suspending arm having a first threaded section in an inner cylindrical surface thereof; the driving member comprising a motor and a transmission rod; the motor being disposed on the inner top surface of the suspending arm and comprising a shaft having a second threaded section in an outer surface thereof; and the transmission rod being a cylinder and a diameter thereof being slightly less than an inner diameter of the suspending arm, the transmission rod having a third threaded section in an outer cylindrical surface thereof and threadedly engaged with the first threaded section, a blind hole along the a central axis thereof, and a fourth threaded section in an inner surface of the blind hole and threadedly engaged with the second threaded section.

5. The wet coating system of claim 3, wherein the main body, the connecting arm, and the suspending arm are hollow, an inner space of the main body communicating with an inner space of the connecting arm, and the inner space of the connecting arm communicating with an inner space of the suspending arm; the main body defining an inlet communicating with the inner space thereof; the suspending arm defining a plurality of outlets facing the clamper and communicating with the inner space of the suspending arm, the outlet facing the clamper; and the substrate holding unit further comprising a blower configured for blowing a gas into the inlet.

6. The wet coating system of claim 5, wherein the blower is configured for blowing noble gas.

7. The wet coating system of claim 3, wherein the substrate holding unit further comprises a monitor configured for monitoring parameters associated with depositing of a thin film on the substrate.

8. The wet coating system of claim 7, wherein the monitor is disposed on one end of the suspending arm opposite to an end of the suspending arm which is adjacent to the container.

9. The wet coating system of claim 7, wherein the monitor comprises a sensor attached to the clamper for measuring the parameters associated with depositing of the thin film.

10. The wet coating system of claim 1, further comprising an inlet pipe, an inlet valve installed on the inlet pipe to control the flow of the coating solution flowing in the inlet pipe, and an inlet branch communicating the inlet pipe with the container.

11. The wet coating system of claim 1, further comprising a discharging branch communicating with the container to discharge the coating solution from the corresponding container, an outlet pipe communicating with the discharging branch to collect the coating solution of the discharging branch, and an outlet valve installed on the outlet pipe to control the flow of the coating solution flowing in the outlet pipe.

12. The wet coating system of claim 1, wherein the mechanical arm moves the substrate across the coating chamber, the annealing chamber, and the unloading chamber in a no air environment.

13. A wet coating system comprising:

a coating chamber configured for coating a plurality of substrates therein;

an annealing chamber communicating with the coating chamber and configured for allowing the substrates to be annealed therein;

a reacting room disposed in the coating chamber, a plurality of containers being placed in the reacting room and filled with coating solution;

a substrate holding unit suspended above the reacting room and moveable down towards the containers or up away from the containers, the substrate holding unit configured for holding the substrates and moving each of the substrates into a corresponding one of the containers to dip the substrates in the coating solution; and a mechanical arm configured for holding each of the substrates in turn and moving the substrates from the coating chamber to the annealing chamber in a no air environment.

14. The wet coating system of claim 13, further comprising an unloading chamber configured for allowing the substrates to be unloaded therein, wherein the mechanical arm is also configured for moving the substrates from the annealing chamber to the unloading chamber in a no air environment.

15. The wet coating system of claim 13, wherein the substrate holding unit comprises a main body, a plurality of holding members, and a plurality of connecting arms, each of the holding members is connected to the main body via a respective connecting arm, and the holding members are configured for holding the substrates.

16. The wet coating system of claim 15, wherein each of the holding members comprises a suspending arm and a clamper, one end of the suspending arm is connected to a corresponding one of the connecting arms, the other end of the suspending arm is connected to the damper, and the damper is structured and mechanized to fittingly clamp a corresponding one of the substrates.

17. The wet coating system of claim 15, wherein each of the holding members comprises a suspending arm connected to a corresponding one of the connecting arms, a clamper for clamping a corresponding one of the substrates, and a driving member, the driving member comprises a motor and a transmission rod, the motor is fixed to the suspending arm, the transmission rod is engaged to the motor, the damper is fixed to a free end of the transmission rod, and the motor is configured to drive the transmission rod to move up or down.

18. The wet coating system of claim 17, wherein the suspending arm comprises a first threaded section in an inner surface thereof, the transmission rod comprises a second threaded section in an outer surface thereof, and the second threaded section of the transmission rod is threadedly engaged with the first threaded section of the suspending arm.

19. The wet coating system of claim 18, wherein the motor comprises a shaft having a third threaded section in an outer surface thereof, a blind hole is defined in the transmission rod along a central axis of the transmission rod, the transmission rod further comprises a fourth threaded section in an inner surface of the blind hole, and the fourth threaded section of the transmission rod is threadedly engaged with the third threaded section of the shaft.

* * * * *